United States Patent
Yamanaka et al.

(10) Patent No.: US 6,943,502 B2
(45) Date of Patent: Sep. 13, 2005

(54) ELECTRONIC BALLAST FOR A DISCHARGE LAMP

(75) Inventors: Yukio Yamanaka, Osaka (JP); Nobukazu Miki, Osaka (JP); Tadahiro Kono, Osaka (JP); Toshihiro Nishida, Osaka (JP); Yoshikazu Kado, Osaka (JP)

(73) Assignee: Matsushita Electric Works, Ltd., Kadoma (JP)

( * ) Notice: Subject to any disclaimer, the term of this patent is extended or adjusted under 35 U.S.C. 154(b) by 214 days.

(21) Appl. No.: 10/239,186

(22) PCT Filed: Apr. 6, 2001

(86) PCT No.: PCT/JP01/03018

§ 371 (c)(1),
(2), (4) Date: Mar. 14, 2003

(87) PCT Pub. No.: WO01/97572

PCT Pub. Date: Dec. 20, 2001

(65) Prior Publication Data

US 2004/0222752 A1 Nov. 11, 2004

(30) Foreign Application Priority Data

Jun. 12, 2000 (JP) ...................... 2000-175841

(51) Int. Cl.$^7$ .............................. H05B 37/00
(52) U.S. Cl. ..................... 315/224; 315/307
(58) Field of Search ................. 315/224, 225, 315/219, 209 R, 244, 247, 291, 307, 308; 362/206, 217, 221, 224, 260

(56) References Cited

U.S. PATENT DOCUMENTS

| | | | |
|---|---|---|---|
| 4,438,372 A | * 3/1984 | Zuchtriegel | 315/224 |
| 4,729,740 A | 3/1988 | Crowe et al. | 439/76 |
| 5,266,869 A | * 11/1993 | Usami | 315/224 |
| 5,315,214 A | 5/1994 | Lesea | 315/209 R |
| 5,500,576 A | 3/1996 | Crouse et al. | 315/307 |
| 5,654,609 A | 8/1997 | Zarich et al. | 362/260 |
| 5,828,187 A | 10/1998 | Fischer | 315/291 |
| 6,008,593 A | 12/1999 | Ribarich | 315/307 |
| 6,039,582 A | 3/2000 | Doikas et al. | 439/76.1 |
| 6,075,322 A | * 6/2000 | Pauly | 362/206 |

FOREIGN PATENT DOCUMENTS

| | | |
|---|---|---|
| GB | 2 336 254 | 10/1999 |
| TW | 354701 | 3/1999 |
| WO | 99/07197 | 2/1999 |

OTHER PUBLICATIONS

W. Chen et al.: "An improved charge pump electronic ballast with low THD and low crest factor" APEC '96. Eleventh Annual Applied Power Electronics Conference and Exposition, vol. 2, conf. 11, pp. 622–627 Mar. 3, 1996–Mar. 7, 1996.

* cited by examiner

Primary Examiner—Wilson Lee
(74) Attorney, Agent, or Firm—Oblon, Spivak, McClelland, Maier & Neustadt, P.C.

(57) ABSTRACT

An electronic ballast for a discharge lamp has a compact arrangement of electric parts. The ballast includes an AC-DC converter and an inverter giving a high frequency output voltage for operating the lamp. The inverter includes switching elements, a control circuit, and an output transformer for connection with the lamp. A single circuit board mounts the electric parts forming the converter and the inverter. The circuit board is accommodated within a tubular casing together with a dielectric sheet which is provided for insulating the circuit board as well as the electric parts from the casing. The output transformer is mounted on a top surface of the circuit board together with some of the other electric parts. The ballast includes chip components forming a detection circuit for lamp condition, and the circuit board mounts the chip components on a bottom surface at a location immediately opposite of the output transformer.

22 Claims, 9 Drawing Sheets

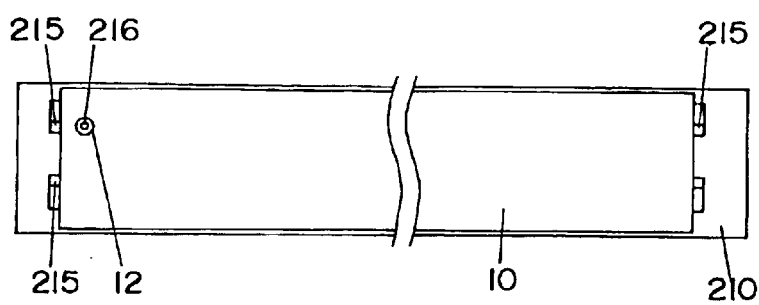
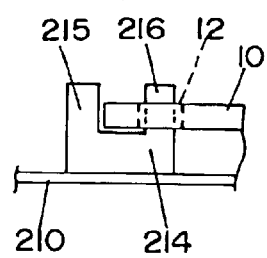
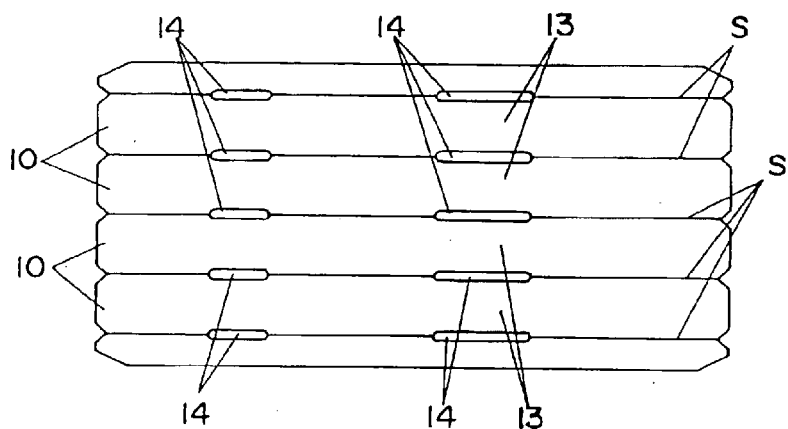
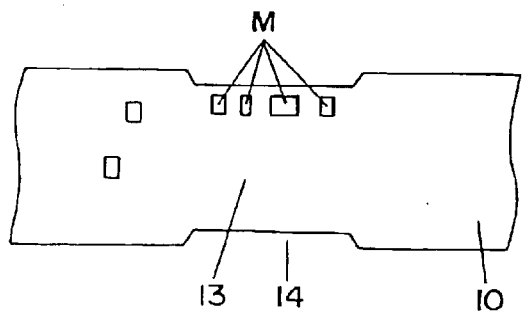

ELECTRONIC BALLAST FOR A DISCHARGE LAMP

TECHNICAL FIELD

The present invention relates to an electronic ballast for a discharge lamp, and more particularly to an assembly of the electronic ballast which is added with a sophisticated function but is made compact enough to be installed in a limited space.

BACKGROUND ART

A prior art electronic ballast for a discharge lamp has been designed to assemble various electric parts forming the circuits of the ballast into a single casing. In the prior ballast, it has been a practice to use a circuit board which mounts on its one surface the electric parts and is assembled into the casing. When the ballast is required to have an added function of, for example, controlling the operation of the discharge lamp based upon the operating condition of the discharge lamp, the circuit board is designed to mount a corresponding number of parts forming a detection circuit of detecting the operating condition of the discharge lamp, and therefore requires an extra space for accommodating the parts of the detection circuit. Further, when the ballast is designed to have an inverter with an output transformer which is inherently large, the circuit board has to be correspondingly large enough to mount the output transformer together with the other electric parts. Accordingly, the prior art ballast has an underlying problem in that it is difficult to be made compact for easy installation in a limited space when the ballast is equipped with the added function of controlling the operation of the discharge lamp based upon the detected operating condition thereof and includes the output transformer.

DISCLOSURE OF THE INVENTION

The above problem has been solved by the present invention which provides an improved architecture of enabling compact arrangement of the electric parts forming the circuits of the ballast when the ballast is equipped with a detection circuit for detection of the operating condition of the discharge lamp and includes an output transformer. An electronic ballast in accordance with the present invention comprises an AC-DC converter adapted to be connected to receive a source AC voltage and convert the source AC voltage into a DC voltage. An inverter is provided to give a high frequency output voltage from the DC voltage for operating the discharge lamp. The inverter includes at least one switching element, a control circuit for the switching element, and the output transformer adapted to be connected to the discharge lamp. The control circuit activates the switching element to repetitively interrupt the DC voltage to provide the high frequency output voltage to the discharge lamp through the output transformer. Included in the ballast is a single circuit board mounting thereon electric parts which constitute the converter and the inverter. The circuit board mounting the electric parts is accommodated within a tubular casing together with a dielectric sheet which is provided for insulating the circuit board as well as the electric parts from the casing. The output transformer is mounted on a top surface of the circuit board together with some of the other electric parts. The characterizing feature of the present invention resides in that the ballast includes a plurality of chip components forming the detection circuit for detection of an operating condition of the discharge lamp, and that the circuit board mounts the chip components of the detection circuit on a bottom surface at a location immediately opposite of the output transformer.

Thus, the circuit board can be insulated successfully from the casing by the use of the dielectric sheet, thereby minimizing a spacing between the circuit board and the casing to achieve a low profile structure for the assembly of the ballast. Further, the dead space left immediately behind the output transformer of inherently large configuration can be best utilized to mount the chip components forming the detection circuit responsible for achieving an added function of the ballast, thereby achieving compact arrangement of the electric parts on the circuit board for reducing a size requirement of the circuit board and therefore contributing to a compact design of the ballast equipped with the output transformer and with the detection circuit.

Accordingly, it is a primary object of the present invention to provide an electronic ballast for a discharge lamp which is capable of being designed into a compact structure sufficient to be installed in a limited space even with the provision of the output transformer and the added detection circuit for detection of the operating condition of the discharge lamp.

In a preferred version, the detection circuit includes a resistor network composed of chip resistors for dividing the output voltage of the inverter into a detection voltage which is fed to the control circuit for control of the inverter. Since the output voltage is divided into the detection voltage being fed to the control circuit, the circuit board can be designed to have less restriction with regard to dielectric distance for a path of feeding the detection voltage to the control circuit on the bottom of the circuit board, thereby realizing a compact arrangement of the circuit.

The detection circuit may also include a chip capacitor which is surface-mounted on the bottom surface of the circuit board together with chip resistors forming the resistor network.

Also, the ballast may include another detection circuit in the form of a resistor network composed of chip resistors for detection of whether the discharge lamp is connected to the inverter. The chip resistors are also surface-mounted on the bottom of the circuit board immediately opposite of the output transformer.

The output transformer is preferably in the form of a flat configuration. In order to give sufficient electrical insulation to the output transformer, the dielectric sheet is configured to have an extension which covers the entire top face of the output transformer. With this insulation by the extension of the dielectric sheet, no further extra spacing is required between the output transformer and the casing, thereby reducing an overall height of the assembly. Therefore, it is another object of the present invention to provide the electric ballast which is capable of realizing a low profile structure of the assembly.

The inverter includes a smoothing capacitor which accumulates therein the DC voltage from the converter, and may further include a set of capacitors which generate a relatively large amount of heat. The circuit board is preferred to be of an elongated configuration and designed to mount the output transformer and the set of the capacitors on its top surface at its opposite longitudinal ends thereof, respectively. The smoothing capacitor is mounted on the top surface of the circuit board intermediate between the longitudinal ends thereof so as to be less affected thermally from the output transformer as well as the set of the capacitors. Thus, the smoothing capacitor of which operation life may be shortened by exposure to the heat can be well protected thermally from the heat generating parts, enjoying a prolonged operation life.

Preferably, the casing is of an elongated configuration and is composed of a lower case having a base and a pair of lower side walls upstanding from the opposite lateral sides of the base, and an upper case having a top and a pair of upper side walls depending from the opposite lateral sides of the top to overlap the lower side walls, respectively. The switching element is molded into a flat resin package and is mounted on the circuit board intermediate the opposite longitudinal ends and at one lateral side of the circuit board so as to project on the top surface of the circuit board. The resin package has a major surface being held in intimate contact with one of the lower side walls for escaping heat generated at the switching element to the lower case. Thus, the heat radiation of the switching element can be made by best utilization of the lower case. Further, due to the heat radiation effect, the switching element can be located rather adjacent to the smoothing capacitor without thermally affecting the latter, which assures a compact arrangement of the parts on the circuit board.

The one of the lower side walls may be formed with a recess of which bottom projects inwardly of the lower case. The recess is located intermediate the longitudinal ends of the lower case. The package of the switching element is secured to the bottom of the recess by means of a spring clip for making the major surface of the package intimate contact with the bottom of the recess. The spring clip is shaped into a U-shaped configuration having a pair of resilient legs connected by a thin flat member for pinching an upper portion of the package and the bottom of said recess between the legs. The thin flat member is kept in intimated contact with a top of the package as well as with the top of the upper case for escaping the heat generated at the package also to the upper case through the member. The resilient leg is dimensioned to have a thickness smaller than a depth of the recess. Thus, the spring clip can facilitate to secure the package in intimate contact with the bottom of the recess. Further, the member of the spring clip acts to escape the heat from the package also to the upper case, improving the heat radiation of the package, which is a further object of the present invention. In addition, the leg of the spring clip is received within the depth of the recess so that the spring clip does not add an extra width to the casing or the entire assembly of the ballast.

Preferably, the inverter includes a pair of switching elements connected in series across an output of the AC-DC converter. The control circuit includes a driver having a level-shift circuit for providing a high driving voltage to turn on a high side one of the switching elements. The control circuit is integrated together with the driver into a single chip which is mounted on the bottom surface of the circuit board at a location intermediate the longitudinal ends of the circuit board. With this architecture of integrating the control circuit and the driver into the single chip, a plurality of discrete components forming the control circuit and the driver can be assembled into the single part for reducing a number of the overall parts mounted on the circuit board and therefore realizing a compact arrangement of the ballast.

The inverter includes a plurality of capacitors each of which may be in the form of a film capacitor. Also, the circuit board is preferably provided on its top surface at the longitudinal ends respectively with an input terminal socket for connection of the converter to the source AC voltage and an output terminal socket for connection of the output transformer to the discharge lamp. The output transformer is disposed adjacent to the output terminal, while the film capacitors are mounted collectively on the circuit board between the output transformer and the output terminal socket. Thus, the film capacitors which develop only relatively low amount of heat can be closely packed into a small space without giving substantial thermal effect to each other, thereby increasing mounting density of the parts to make the assembly compact.

The circuit board may have an approximately uniform width along the length thereof. The width is selected to be nearly equal to a width of the output transformer which is greatest among all of the electric parts. Thus, the assembly can be reduced to as less as the width of the output transformer for achieving a compact design for the assembly.

The circuit board is formed on its bottom surface with a ground line for the inverter, and with a main current path carrying a high frequency current to the output transformer. The main current path includes a pair of main current lines major portions of which run in close parallel relation to each other. The chip of the control circuit is mounted on the bottom surface of the circuit board to be isolated from the main current lines by the ground line so that the control circuit can be protected from being affected by noises occurring in the main current path. Further, since the major portions of the main current lines run in close parallel relation to each other, it is readily possible to minimize an area confined by the main current path, thereby reducing an amount of radiation noise therefrom.

The circuit board is preferably separated from an array in which a plurality of the circuit boards are arranged side-by-side with a separation line between the adjacent ones of the circuit boards. Each circuit board has a reduced-in-width section within the length thereof to define a slit along the separation line between the adjacent circuit boards. The inverter includes at least one capacitor in the form of a chip-type ceramic capacitor. The chip-type ceramic capacitor is mounted on the reduced-in-width section. Since the reduced-in-width section can be less affected by a stress developed when separating the circuit board from the array, the chip-type ceramic capacitor can be well protected from the stress so as to be kept intact for reliability of the inverter.

The electric parts includes a plurality of chips each having terminals on opposite ends thereof, respectively. The chips are mounted on the bottom surface of the circuit board with all of the terminals oriented in a width direction of said circuit board. Thus, the terminals of the chips can be equally and reliably soldered to the circuit board when the circuit board is fed through a soldering bath along the length of the circuit board.

The dielectric sheet is preferred to have a plurality of studs for supporting the circuit board. With the provision of the studs, the circuit board can be stably supported on the dielectric sheet in such a manner as to avoid unnecessary engagement between the leads of some electric parts and the dielectric sheet which might otherwise damage the dielectric sheet.

The case may be provided with positioning means for holding the circuit board in correct position for easy assembly of the ballast.

The output transformer is preferred to include a first auxiliary winding which provides a driving voltage for energizing the control circuit, a second auxiliary winding which provides a detection output indicative of the high frequency output voltage for monitoring the operation of the discharge lamp, and a third winding which provides a preheat current to filaments of the discharge lamp. Thus, the output transformer alone can provide versatile functions, which reduces the number of the discrete components for the inverter, leading to a compact assembly of the ballast.

Preferably, the output transformer is a leakage transformer having a primary winding connected in circuit to flow a high frequency current, and a secondary winding which is magnetically coupled to the primary winding to induce the high frequency output voltage being applied to the discharge lamp. With the use of the output transformer of the leakage type, a leakage inductance can be best utilized as an oscillation inducing inductance for the inverter operation, requiring no additional separate inductance and therefore reducing the number of the overall components of the inverter for compact arrangement of the ballast. Further, the first auxiliary winding is coupled to the first auxiliary winding so as to provide the driving voltage for energizing the control circuit. Thus, the control circuit can be stably supplied with the energy irrespective of the operating condition of the discharge lamp. Also, the second auxiliary winding is coupled to the secondary winding so as to provide the detection output indicative of the high frequency output voltage such that the second auxiliary winding can provide the detection output reliable enough for detection of the operating condition of the discharge lamp.

The AC-DC converter includes a rectifier providing the rectified DC voltage. The control circuit is preferred to include a dropping resistor which is connected to the rectifier for deriving a DC voltage for energizing the control circuit at the time of starting the inverter. Thus, the dropping resistor is integrated into the control circuit to reduce the number of the discrete components.

Most preferably, the inverter is of a charge-pump type having a capacitor which is connected in a path of receiving an input current from said AC-DC converter and flowing the input current through an oscillating element of the inverter and through the switching element for restraining harmonics in the input current from the source AC voltage. With the use of the charge-pump type inverter, it is possible to restrain the harmonics of the input current from the source AC voltage and therefore improve power factor of the ballast without requiring any external harmonic filter, contributing to reduce the number of the circuit components for the inverter capable of suppressing the harmonics.

The ballast may include an adjusting means mounted on the circuit board to adjust output characteristics of the discharge lamp for operating the discharge lamp successfully even when the ballast is energized by the source AC voltage of different voltages, thereby enabling to operate the lamp consistently from the differing AC voltage sources with the use of the common ballast.

The adjustor means can operate to adjust a lamp start output power and a lamp operating output power fed to the discharge lamp respectively at the time of starting the lamp and during the steady-state operation of the lamp, thereby minimizing electrical stress applied to the electric components of the inverter and therefore giving reliability thereto, in addition to facilitating the circuit design of the inverter.

These and still other objects and advantageous features of the present invention will become more apparent from the following description of the preferred embodiment when taken in conjunction with the attached drawings.

BRIEF DESCRIPTION OF THE DRAWINGS

FIGS. 16 and 17 are schematic top views illustrating modified arrangements for supporting the circuit board to the lower casing, respectively;

FIG. 18 illustrates an end portion of the circuit board engaged with a positioning stand of the lower case according to the arrangement of FIG. 17;

FIG. 19 is a plan view illustrating an array of the circuit boards which are to be separated from each other;

FIG. 20 is a sectional view of the array; and

FIG. 21 a plan view of a portion of the circuit board in accordance with a further modification of the embodiment.

BEST MODE FOR CARRYING OUT THE INVENTION

Figure 1:
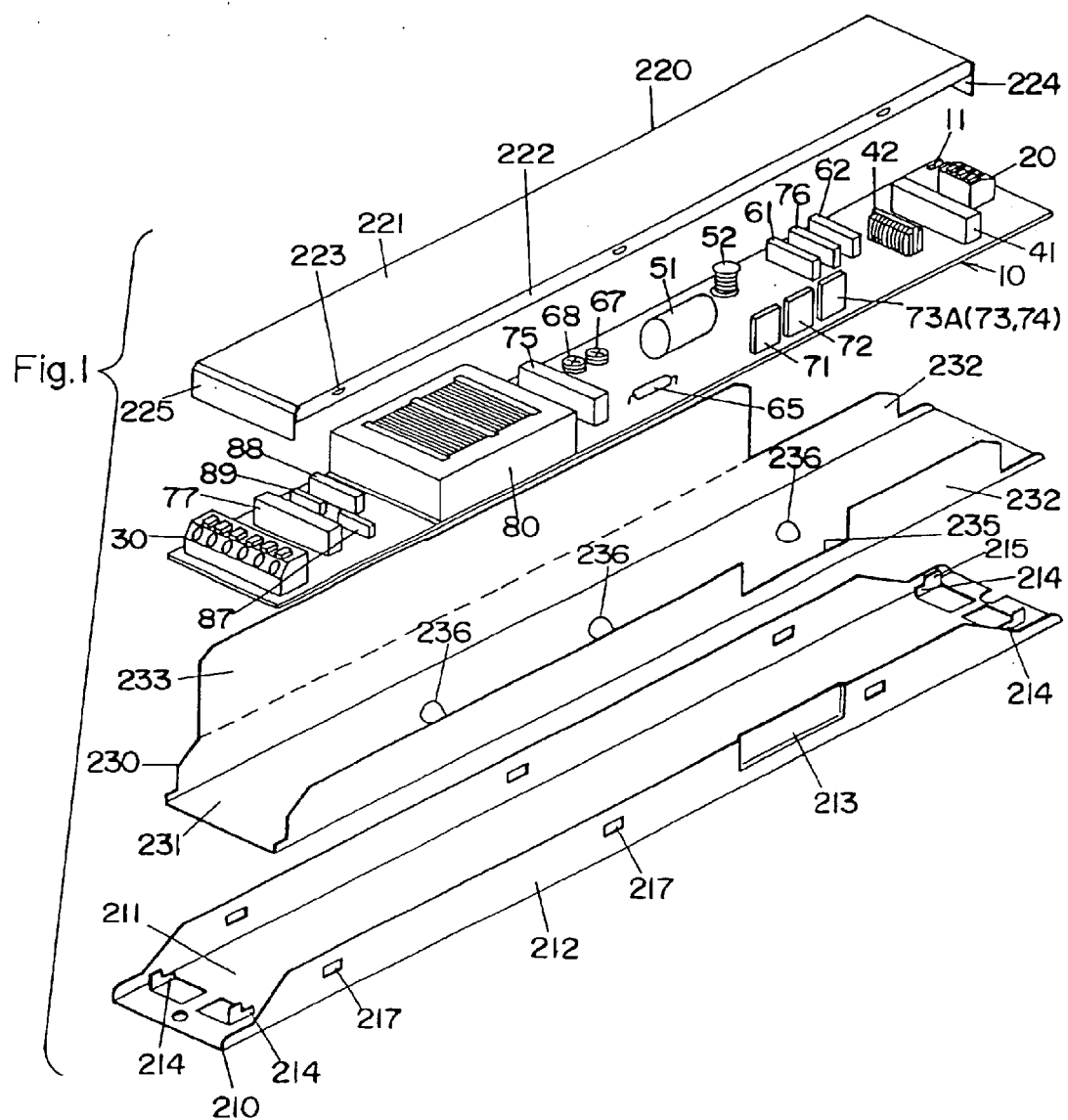
FIG. 1 is an exploded perspective view of an electronic ballast for a discharge lamp in accordance with a preferred embodiment.

Referring now to FIG. 1, there is shown an electronic ballast in accordance with a preferred embodiment of the present invention. The ballast comprises a circuit board 10 mounting various electric parts forming an electric circuit of the ballast, a tubular casing composed of a lower case 210 and an upper case 220 to enclose the circuit board, and a dielectric sheet 230 covering the circuit board 10 as well as the electric parts for insulating the same from the casing. The casing is made of a metal such as steel and aluminum. The circuit board 10 is of an elongated configuration and provided on its top surface at its opposite longitudinal ends respectively with an input terminal socket 20 for wiring connection with an AC mains 21 and with an output terminal socket 30 for wiring connection with discharge lamps LA1 and LA2. The circuit board is made of a phenol resin impregnated paper or a composite epoxy material (CEM).

Figure 3:
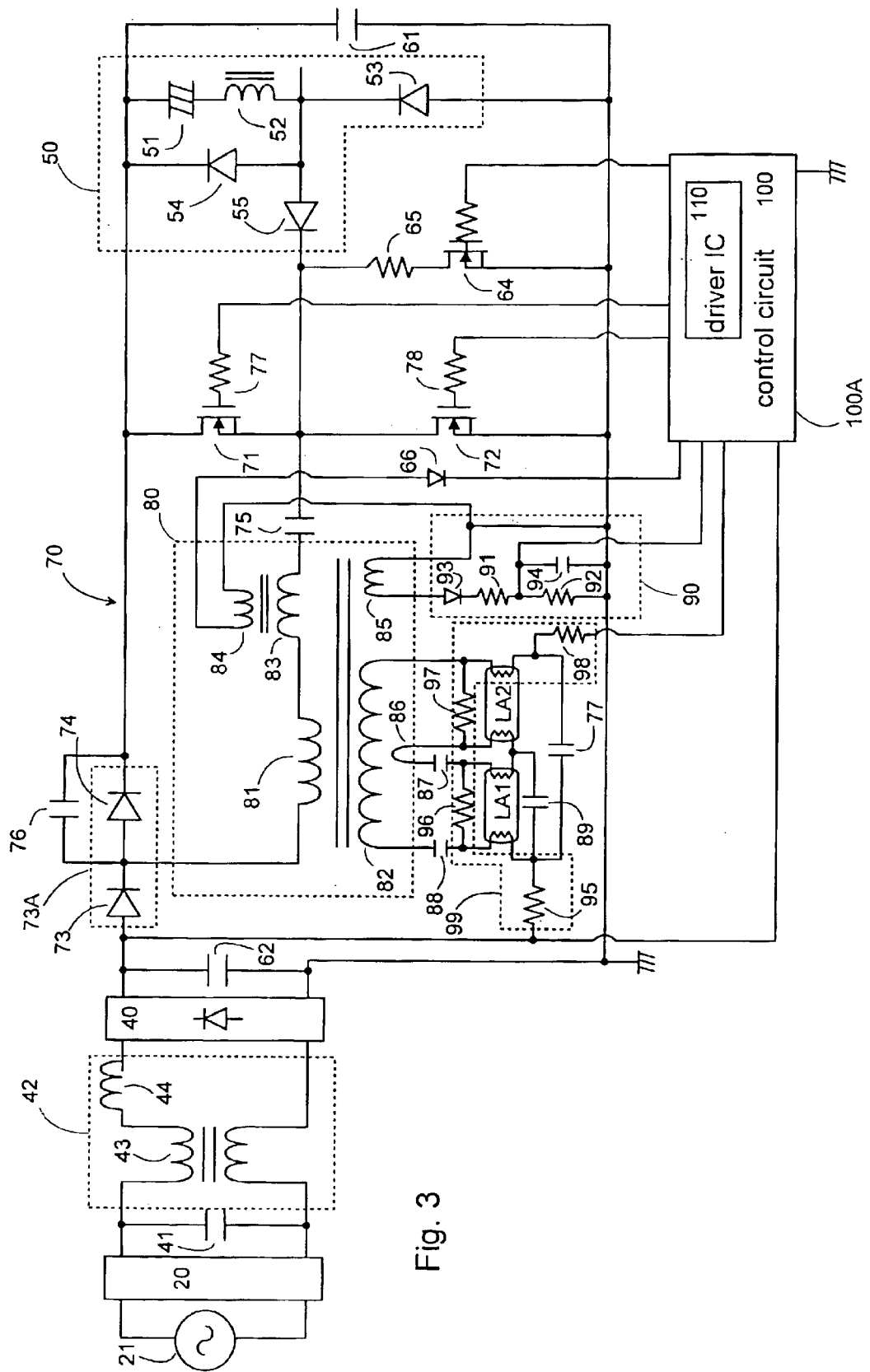
FIG. 3 is a circuit diagram of the above ballast.

FIG. 3 shows the ballast circuit which is designed to operate two discharge lamps LA1 and LA2. The ballast circuit has an AC-DC converter 40 in the form of a full-wave diode-bridge rectifier which is connected through the input terminal socket 20 to receive a source AC voltage from the AC mains 21 and convert the source AC voltage into a pulsating DC voltage. The converter 40 is connected to the AC mains 21 through a filtering capacitor 41, and a filter 42 composed of a common-mode choke 43, and a normal-mode choke 44. The pulsating DC voltage from the rectifier 40 is smoothed by a step-down chopper 50 composed of a smoothing capacitor 51, an inductor 52, diodes 53 to 55, and a switching element 72. The smoothing capacitor 51 is connected in series with the inductor 52 and diode 53 across the rectifier 40 in a parallel relation respectively with capacitors 61 and 62. The circuit includes an inverter 70 which converts the DC voltage into a high frequency output AC voltage to be applied to the discharge lamps LA1 and LA2. The inverter 70 comprises a series connected pair of switching elements 71 and 72 connected across the rectifier 40 in series with a series combination of diodes 73 and 74, and a leakage-type output transformer 80 having a primary winding 81 and a secondary winding 82. The primary winding 81 is connected across the switching element 71 in series with an inductance 83 which is given by a leakage inductance of the transformer, a DC blocking capacitor 75 and diode 74. The secondary winding 82 is connected across a series combination of the discharge lamps LA1 and LA2 in parallel relation to an oscillation-inducing capacitor 77. The switching element 72 is connected in series with the primary winding 81, leakage inductance 83, capacitor 75, and diode 73 across the rectifier 40 for drawing in an input current through the switching element 72. A distortion improving capacitor 76 is connected across diode 74.

Switching elements 71 and 72, each realized by a MOS-FET having an inherent parasitic diode permitting a reverse current flow, are controlled to turn on repetitively at a high frequency in an alternate fashion with each other so as to generate the high frequency voltage at a resonance circuit composed of the leakage inductance 83, discharge lamps LA1, LA2, and capacitor 77, thereby applying the high frequency output voltage to operate the discharge lamps.

Switching elements 71 and 72 are controlled to turn on and off by a control circuit 100 including a driver IC 110 which provides driving voltages to gates of switching elements 71 and 72 respectively through resistors 77 and 78. Capacitor 61 is connected in parallel with the series combination of smoothing capacitor 51, inductor 52, and diode 53 of the step-down chopper 50 to bypass the high frequency output of the inverter, while capacitor 62 is connected across the rectifier 40 to bypass the high frequency output of the inverter for reducing a stress at the rectifier 40.

The smoothing capacitor 51 is connected in series with a switching element 64 and a resistor 65 across the rectifier 40. The switching element 64 is controlled by the control circuit 100 to be kept turned off only at the time of energizing the inverter in order to restrict a rushing current from flowing into the inverter for protection of the circuit. After the smoothing capacitor 51 is charged, the switching element 64 is turned off to enable the inverter operation of providing the high frequency output voltage.

The output transformer 80 additionally includes a first auxiliary winding 84, a second auxiliary winding 85, and a third auxiliary winding 86 which induce individual voltages proportion to the high frequency output voltage of the inverter. The first auxiliary winding 84 is coupled to the primary winding 81 to provide a power through a diode 66 to the control circuit. Since the first auxiliary winding 84 is coupled on the side of the primary winding 81, it can supply the power to the control circuit 100 stably without being affected by the condition of the discharge lamps coupled on the side of the secondary winding 82. The second auxiliary winding 85 is coupled to the secondary winding 82 to provide a voltage corresponding to the high frequency output voltage being applied to the discharge lamps and therefore give a reliable monitoring of the output voltage. The third auxiliary winding 86 is coupled to the secondary winding 82 and is cooperative with a capacitor 87 to provide a preheating current to the filaments of the discharge lamps for facilitating the start-up of the discharge lamps. Incidentally, a capacitor 88 is connected to one end of the secondary winding 82, and a capacitor 89 is connected across the one discharge lamp LA1.

As shown in FIGS. 4A to 4F, the inverter operates to repeat six modes many times during one complete cycle of the AC voltage to suppress harmonics, i.e., input current distortion in the input current from the AC voltage source to the inverter. In these figures, output transformer 80, discharge lamps LA1 and LA2 as well as the associated parts are collectively referred to as a load circuit RL, and also inductor 52, diodes 53 to 55, switching element 64, and resistor 65 are omitted for simplicity.

Figure 4A:
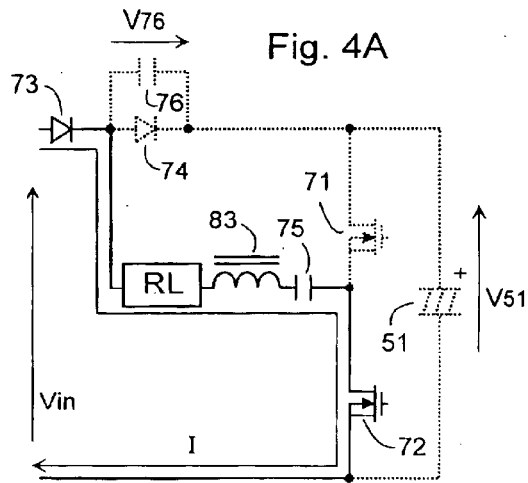
FIGS. 4A to 4F are diagrams showing the operation of an inverter in the above ballast.

Mode 1 (FIG. 4A)

When switching element 72 is on, an oscillating current (resonance current) I is supplied from rectifier 40. In this condition, there is established a relation among voltage V51 of smoothing capacitor 51, voltage V76 of distortion improving capacitor 76, and voltage Vin of the input voltage to the inverter (output voltage of rectifier 40) that $Vin \geq V51+V76$.

Figure 4D:
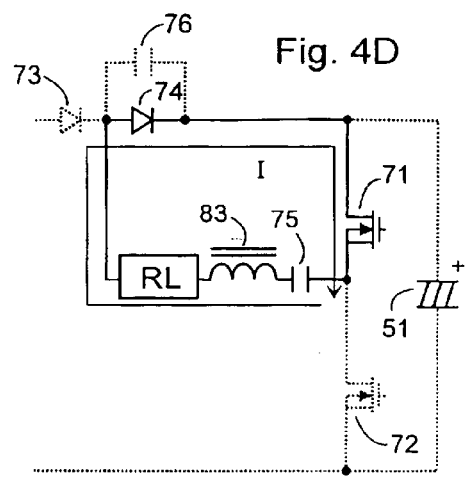
Figure 4B:
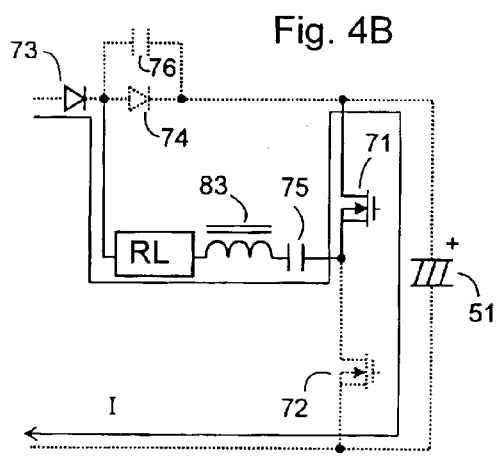

Mode 2 (FIG. 4B)

After switching element 72 goes off, the oscillating current I continues to flow through parasitic diode of switching element 71 to charge smoothing capacitor 51. Then, switching element 71 is triggered to turn on.

Figure 4E:
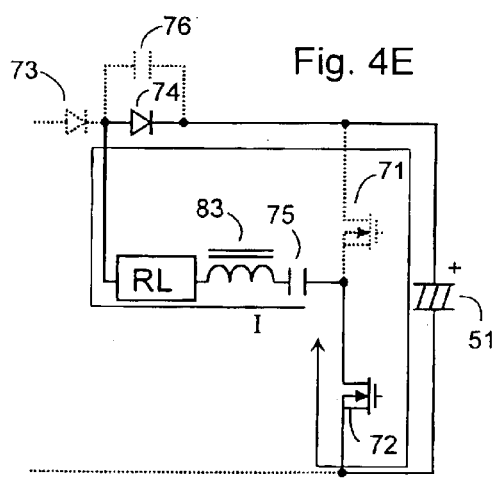
Figure 4C:
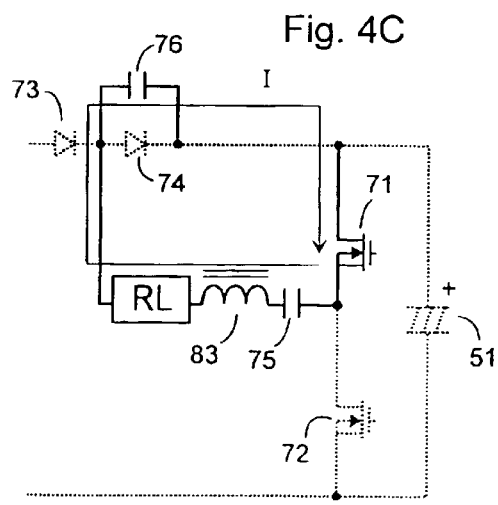

Mode 3 (FIG. 4C)

When leakage inductance 83 of output transformer 80 is exhausted in mode 2, the oscillating current I is reversed due to the charge accumulated in capacitors 76 and 75, while discharging capacitor 76.

Mode 4 (FIG. 4D)

When capacitor 76 is discharged, diode 74 becomes conductive to flow the oscillating current I continuously.

Mode 5 (FIG. 4E)

After switching element 71 is turned off, the oscillating current I continues to flow through parasitic diode of switching element 72 to charge smoothing capacitor 51. Then, switching element 72 is triggered to turn on.

Figure 4F:
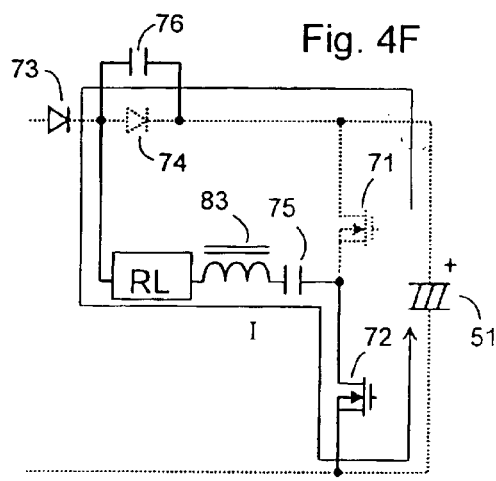

Mode 6 (FIG. 4F)

When leakage inductance 83 of output transformer is exhausted in mode 5, the oscillating current I is reversed due to the charge accumulated in smoothing capacitor 51, thereby charging capacitor 76. When capacitor 76 is charged to such an extent of satisfying the relation that $Vin=V51+V76$, the operation goes back to mode 1.

Therefore, by setting that V51>Vin (peak), and V76 (peak)=V51, the above six modes repeats many times during one complete cycle of the AC voltage from the AC mains, thereby suppressing harmonics (input current distortion) in the input current. In other words, the input current from the AC mains is drawn to flow into the inverter even when the AC voltage is at a lowered level within the cycle of the AC voltage, thereby suppressing the harmonics in the input current. In this sense, the inverter having the circuit configuration of FIG. 3 can be referred to as the inverter of a charge-pump type inherently capable of suppressing the harmonics without requiring additional harmonic suppressing circuit such as a passive filter and an active filter. Thus, the use of the inverter of the charge-pump type can reduce the number of the parts, making the whole ballast assembly into a compact design.

Figure 5:
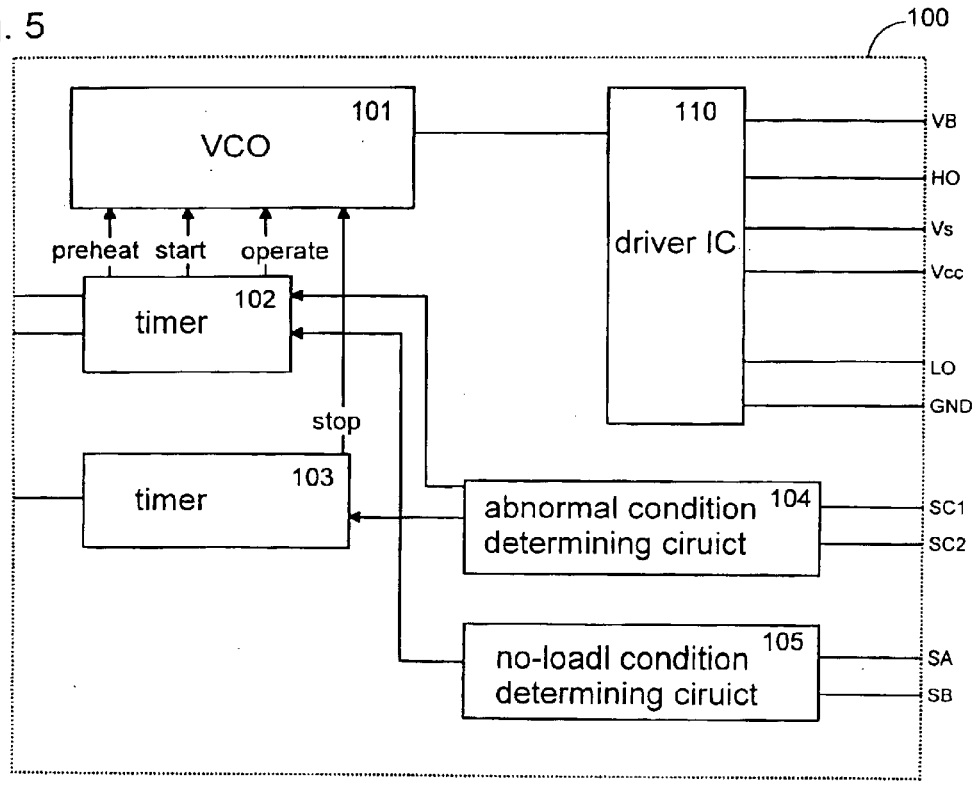
FIG. 5 is a block diagram of a control circuit utilized for control the operation of the inverter.

The control circuit 100 is designed to control the switching elements 71 and 72 in order to preheat, start, and operate the discharge lamps, and also to deactivate the inverter upon detection of an abnormal condition or no-load condition. As shown in FIG. 5, the control circuit 100 comprises a VCO (voltage-controlled oscillator) 101 which provides to driver IC 110 a series of oscillating pulses of which frequency is varied with an applied voltage. The driver IC 110 is responsive to the oscillating pulses from VCO 101 for generating driving voltages for turning on the switching elements 71 and 72, details of which will be discussed later. The control circuit 100 includes a first timer 102, a second timer 103, an abnormal condition determining circuit 104, and a no-load condition determining circuit 105. Further, the control circuit 100 includes a dropping resistor (not shown) which is connected to the rectifier 40 for deriving a DC voltage for energizing the control circuit at the time of starting the inverter. Thereafter, the control circuit 100 is continuously energized by the voltage from the first auxiliary winding 84. The parts forming the circuit of the controller 100 are integrated together with the driver IC 110 into a single chip 100A mounted on the bottom surface of the circuit board 10. The first timer 102 is programmed to provide to VCO 101 voltages respectively controlling driver IC 110 to operate the inverter for preheating, starting, and operating the discharge lamps in accordance with a predetermined time schedule. The abnormal condition determining circuit 104 is connected to monitor the output voltage of the inverter so that it determines an abnormal condition and issue an abnormal signal when the monitored output voltage becomes critically high due to the increased lamp voltage seen at the end of its operation life. Upon receiving the abnormal signal, the first timer 102 operates to cease the inverter for a predetermined time period after which it actuates to restart the inverter. The abnormal signal is also fed to the second timer 103 which measures a time during which the abnormal signal lasts and issues a stop signal when the measured time exceeds over a predetermined level. The stop signal is fed to deactivate VCO 101 so as to stop driving the switching elements. The no-load condition determining circuit 105 is coupled in the circuit to monitor whether the discharge lamps are mounted correctly, and issue a no-load signal when any of the two discharge lamps is dismounted. Upon receiving the no-load signal, the first timer 102 operates to deactivate the VCO 101 for ceasing the inverter.

The output voltage of the inverter is monitored by a voltage monitor which comprises, in addition to the second auxiliary winding 85, a detection circuit 90 having a resistor network of resistors 91 and 92, a diode 93, and a capacitor 94. The resistor network is cooperative with capacitor 94 to provide a divided DC voltage indicative of the output voltage of the inverter to the abnormal condition determining circuit 104. The third auxiliary winding 86 is connected to another detection circuit 99 which is a resistor network composed of resistors 95 to 98 connected in series with the filaments of discharge lamps LA1 and LA2 in a path leading from one end of the rectifier 40 to the no-load condition determining circuit 105 of the control circuit 100. When either or both of the discharge lamps LA1 and LA2 is disconnected, no current will flow through the resistor network of resistors 95 to 99. Upon this occurrence, the control circuit 100 responds to stop the inverter.

Figure 6:
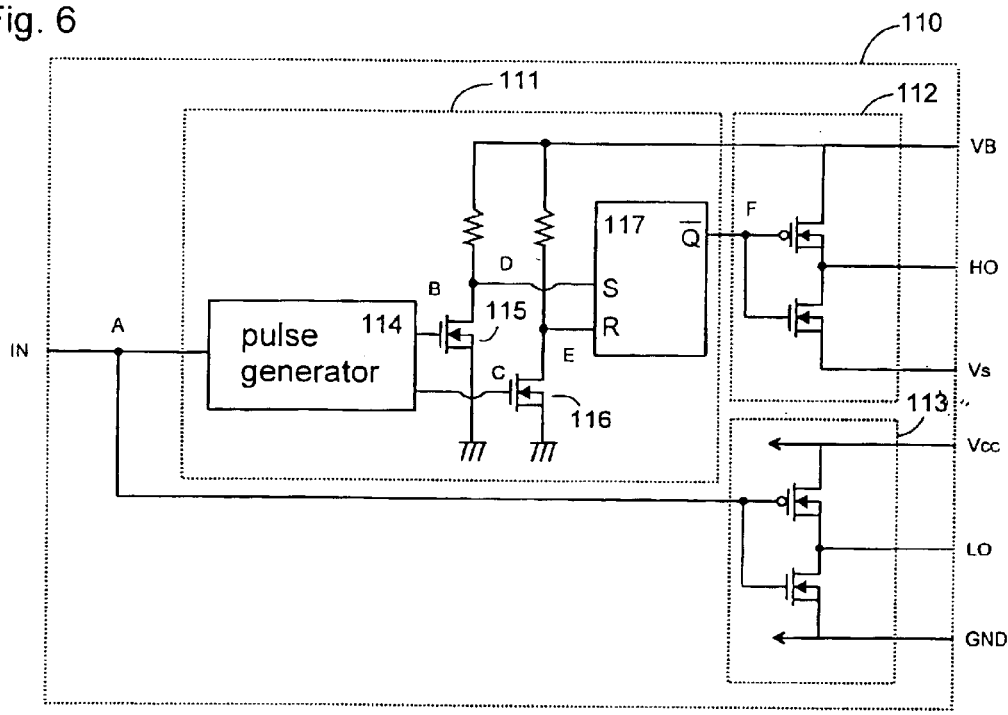
FIG. 6 is a circuit diagram of a driver incorporated in the control circuit.
Figure 7:
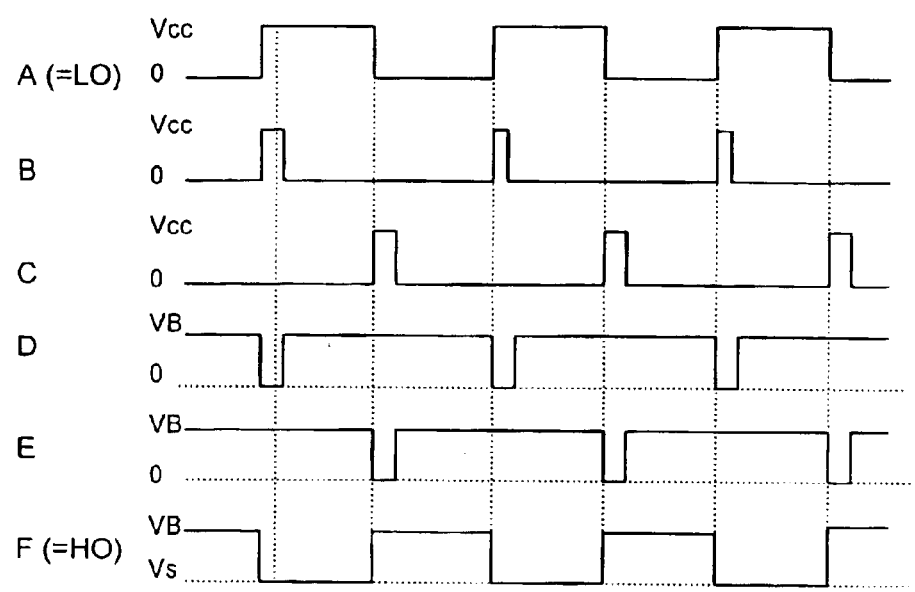
FIG. 7 is a time chart illustrating the operation of the driver.

Now referring to FIG. 6, the driver IC 110 includes a level-shift circuit 111, and a pair of buffer circuits 112 and 113. The level-shift circuit 111 is provided for generating a high driving voltage to turn on the high-side switching element 71, and comprise a pulse generator 114, a pair of transistors 115 and 116, and a flip-flop 117. The signal from the control circuit 100 is processed at the level-shift circuit 111 and through the buffer circuit 112 to provide the high driving voltage at a terminal HO for turning on the high-side switching element 71 of the inverter. While the same signal from the control circuit 100 is processed through the buffer circuit 113 to provide a low driving voltage at terminal LO for turning on the low-side switching element 72 of the inverter. FIG. 7 illustrates waveforms at points A to F in the circuit of FIG. 6.

Figure 2:
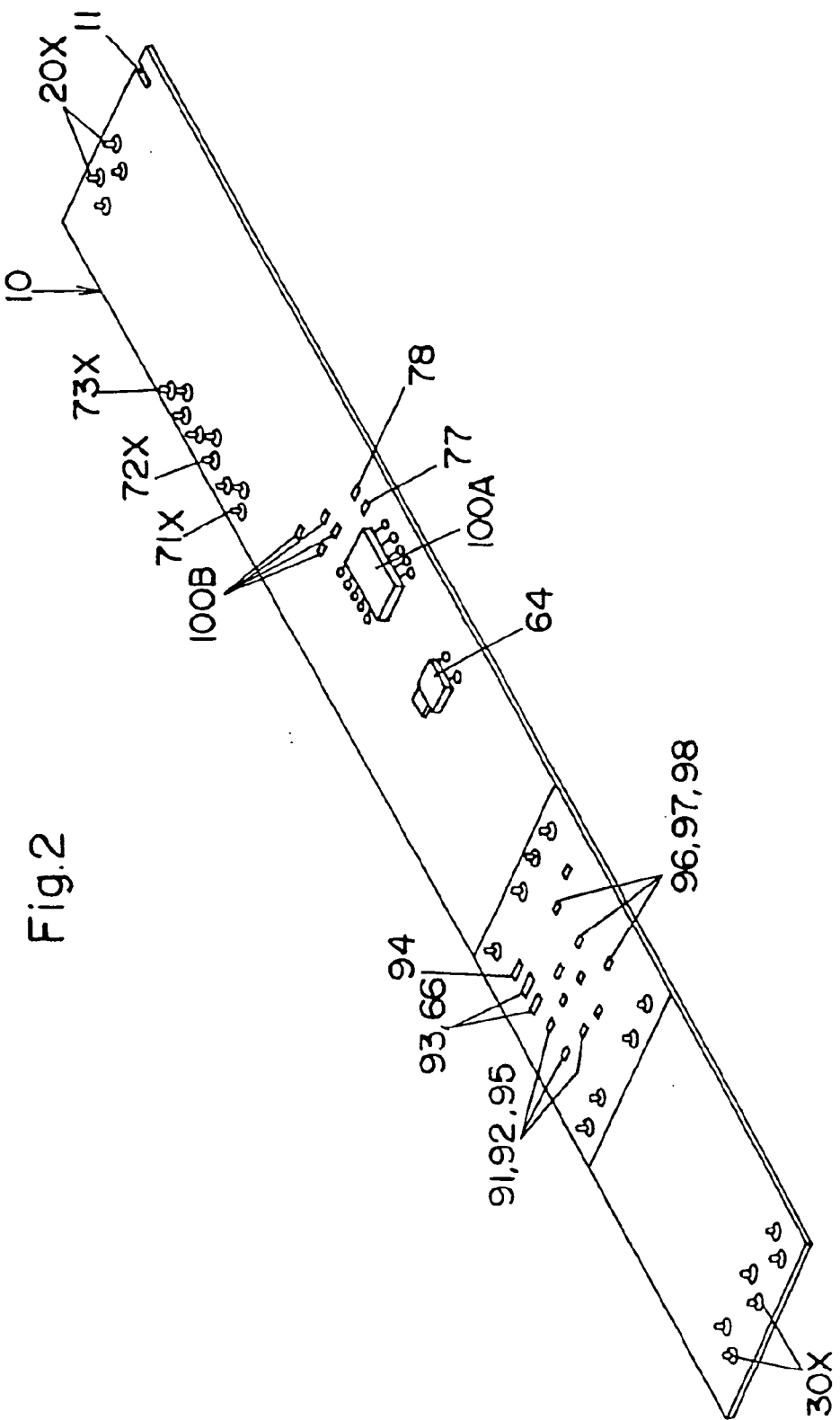
FIG. 2 is a perspective view showing the bottom of a circuit board utilized in the above ballast.

Turning back to FIGS. 1 and 2, there are shown which parts of the ballast circuit are mounted on which portions of the circuit board 10. The circuit board 10 is of an elongated configuration having a uniform width and is formed on its bottom surface with a circuit pattern connecting the parts of the ballast circuit. It is noted that bulk parts are mounted on the top surface of the circuit board, while chip components are mounted on the bottom surface of the circuit board. As seen in FIG. 1, the bulk parts include input terminal socket 20, filtering capacitor 41, filter 42, capacitors 61, 62 and 76, switching transistors 71 and 72, a combination of diodes 73 and 74, inductor 52, smoothing capacitor 51, resistor 65, variable resistors 67 and 68, DC blocking capacitor 75, output transformer 80, capacitors 77, 87 to 89, and the output terminal socket 30. As seen in FIG. 2, the chip components include chip resistors 91, 92, 95 to 98, chip capacitor 94, chip diodes 93 and 66, chip transistor (FET) 64, chip package 100A integrating a portion of the control circuit 100 and the driver IC 110, and chip components 100B forming the remainder of the control circuit 100.

Figure 8:
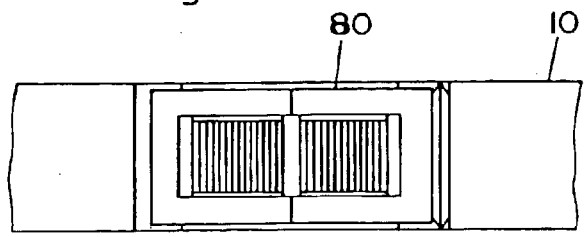
FIG. 8 is a partial top view of the circuit board.

The input terminal socket 20 and the output terminal socket 30 are mounted at the distal longitudinal ends of the circuit board 10. Each of the terminal sockets 20 and 30 has a rapid wire connection and release mechanism for easy wiring connection and disconnection. The output transformer 80 is mounted on one side of the output terminal socket 30 in such a manner as to occupy full width of the circuit board 10. That is, output transformer 80 has a maximum width among the other bulk parts and the circuit board 10 is dimensioned to have the width approximately equal to the width of the output transformer 80, as shown in FIG. 8. Capacitors 77, 87 to 89, each in the form of a film capacitor, are collectively mounted between the output terminal socket 30 and the output transformer 80 such that the film capacitors which develop only relatively low amount of heat can be closely packed into a small space without giving substantial thermal effect to each other.

As discussed hereinbefore with reference to FIG. 3, the detection circuit 90 for monitoring the high frequency output voltage of the inverter and providing the detected voltage to the control circuit 100 are realized by diode 93, resistors 91 and 92, and capacitor 94. All these parts are presented as the chip components and are mounted on the bottom surface of the circuit board 10 at a location immediately opposite of output transformer 80, as shown in FIG. 2, in order to best utilize a space behind the output transformer for adding the detection circuit to the ballast. Further, resistors 95 to 98 forming the detection circuit 99 for detecting whether the discharge lamps are mounted in the portion opposite of output transformer 80 by best utilization of the space behind the output transformer. In FIG. 2, soldered lead ends of input terminal socket 20, output terminal socket 30, output transformer 80, switching elements 71 and 72, and combination 73A of diodes 73 and 74 are indicated respectively by numerals 20X, 30X, 71X, 72X, and 73X.

Turning back to FIG. 1, smoothing capacitor 51 is mounted at the longitudinal center of the circuit board 10 so as to be less thermally affected from output transformer 80 as well as from a set of capacitors 61, 62, and 76 which are mounted at one longitudinal end adjacent to the input terminal socket 20. Since the smoothing capacitor 51 is in the form of an aluminum electrolytic capacitor of which life is shortened when exposed to high temperature, the above arrangement is advantageous to elongate the life of the smoothing capacitor. Switching elements 71 and 72 are each molded into a flat resin package and are mounted at a portion intermediate the longitudinal ends of circuit board 10 and arranged side-by-side along one lateral edge of the circuit board. Also, the combination of diodes 73 and 74 is molded into a like flat resin package 73A which is mounted in an adjacent relation to the switching element 72. In this connection, the chip package 10A, the chip components 100B of control circuit 100, and associated chip resistors 77 and 78 are collectively mounted on the bottom and at near the longitudinal center of the circuit board in a spaced relation from the switching transistors 71 and 72, the control circuit can be well protected from being influenced by the switching elements and therefore be free from noises, in addition to that the control circuit and its associated resistors can be densely packed on the bottom of the circuit board 10.

Figure 9:
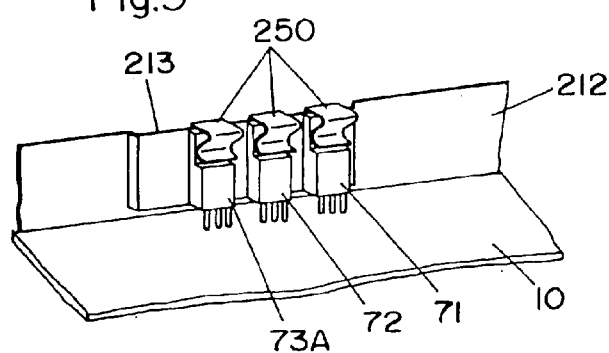
FIG. 9 is a partial perspective view illustrating switching transistors secured to a case of the ballast.
Figure 10:
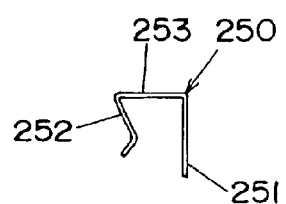
FIG. 10 illustrates a spring clip for securing the switching transistors.
Figure 11:
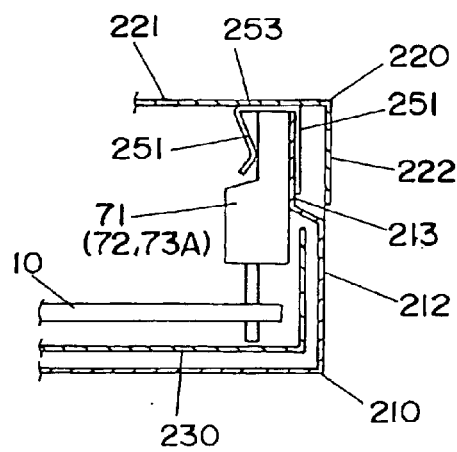
FIG. 11 is a sectional view illustrating the switching transistors secured to the case.

The flat package 71, 72, and 73A are secured to one side wall 212 of the lower case 210 by means of spring clips 250, as shown in FIGS. 9 to 11. As shown in FIG. 1, the side wall 212 is formed with a recess 213 of which bottom projects inwardly of the lower case. It is this recess 213 that serves to hold the packages 71, 72, and 73A and to release the heat thereof into the lower case 210. That is, the major surface of each package is held in an intimate contact with the bottom of the recess 213 to release the heat to the lower case. The spring clip 250 comprises a pair of resilient legs 251 and 252 connected by a thin flat member 253. As shown in FIG. 11, the spring clip 250 serves to retain the upper end of the package 71 (72, 73A) together with the bottom of recess 213 between resilient legs 251 and 252, and with the member 253 in contact with the upper end of the package. When the lower case 210 is covered with upper case 220, member 253 comes into contact with the top 222 of upper case 220, thereby serving to escape the heat of the package also into the upper case 220 and therefore improving heat radiation of the package. As shown in FIG. 11, the thickness of the resilient leg 251 is less than the depth of recess 213 so that the clip does not add an extra width to the whole assembly. The side wall 222 of the upper case 220 is dimensioned to cover the recess 213. It is noted in this connection that the height of the package as measured from circuit board 10 plus the thickness of member 253 of spring clip 250 is nearly equal to the height of output transformer 80. Thus, the height of the assembly is determined by a higher one of the output transformer and the package.

The variable resistors 67 and 68 are included in the control circuit 100 in order to adjust the oscillating frequency of the inverter in accordance with differing source AC voltage available at different areas of the world. Particularly, variable resistor 67 is provided to adjust the oscillating frequency at the time of starting the discharge lamps, while variable resistor 68 adjusts the oscillating frequency at the stable-state operation of the discharge lamps. With the inclusion of variable resistors, it is possible to provide constant luminous output of the discharge lamps irrespective of the different source AC voltages, while minimizing an electrical stress applied to the parts of the inverter.

As shown in FIG. 1, the dielectric sheet 230 is designed to cover almost all of the circuit board 10 and comprises an elongated bottom 231, a pair of side walls 232, and a top extension 233 extending one of the side walls. The top extension 233 is bent over the parts mounted on the circuit board 10 so as to cover at least the entire top of output transformer 80, capacitors 77, 87 to 89, smoothing capacitor 51, capacitor 75, resistor 65, and variable resistors 67 and 68. Capacitor 41 as well as filter 42 which have sufficient insulation capability against the upper case 220 can be left uncovered by the extension 233 so as to improve heat radiation from these parts to the upper case 230. One of the side walls 232 has a cut-out 235 at a portion corresponding to the recess 213 of the lower case 210 for contacting the packages 71, 72, and 73A directly with the bottom of recess 213. Projecting integrally on the bottom 231 of dielectric sheet 230 are longitudinally spaced studs 236 to support the circuit board 10, improving electrical insulation of the circuit board 10 from the bottom of the lower case 210. The studs 236 are formed to abut against the bottom of circuit board 10 at portions free from the lead ends of the parts mounted on top of the circuit board. Thus, the dielectric sheet 230 can be protected from being scratched by the lead ends of the parts on top of circuit board 10. One of the studs 236 is located to support the output transformer 80 which is a heaviest part of the ballast. It is noted in this connection that the lead ends of the parts project on the bottom surface of the circuit board 10 so as not to exceed a maximum height of the chips 64 and 100A mounted on the bottom of circuit board 10.

Figure 12:
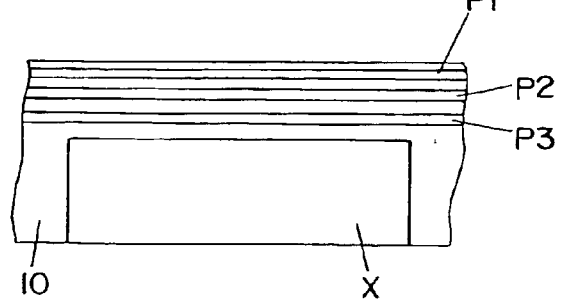
FIG. 12 is a schematic plan view illustrating a portion of the bottom of the circuit board.

As shown in FIG. 12, the circuit board 10 is formed on its bottom with a pair of parallel lines P1 and P2 forming a main current path carrying the high frequency output current to the output transformer 80, and with a ground line P3 of the inverter. The chip components of the control circuit 100 are mounted in an area X which is isolated from the lines P1 and P2 by the ground line P3. Thus, the control circuit can be well protected from being adversely affected by the high frequency current. Further, the main current path can be closely arranged to form a closed circuit occupying an area which is small enough to reduce radiation noise from the main current path.

Figure 13:
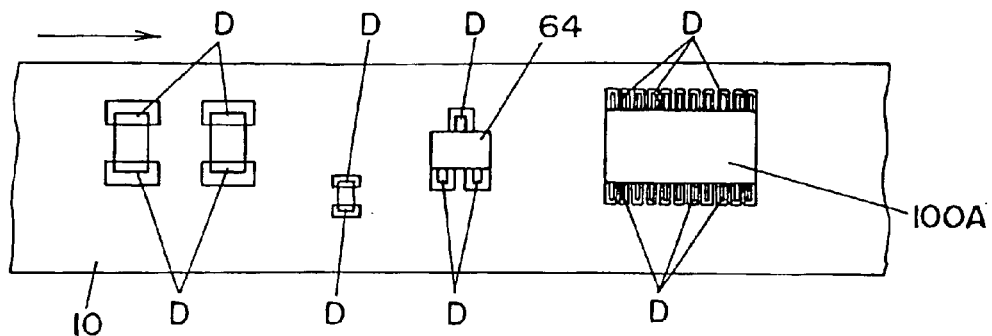
FIG. 13 is a schematic plan view illustrating a portion of the bottom of the circuit board.

As shown in FIG. 13, all the chips including the chip package 100A of the control circuit 100 mounted on the bottom of the circuit board 10 are oriented uniformly such that terminals or electrodes D at the opposite ends of each part are oriented in a width direction of the circuit board 10. This is advantageous for reliable soldering connection of the electrodes D to the circuit pattern while moving the circuit board within a soldering bath along the lengthwise direction (indicated by an arrow) of the circuit board.

Figure 14:
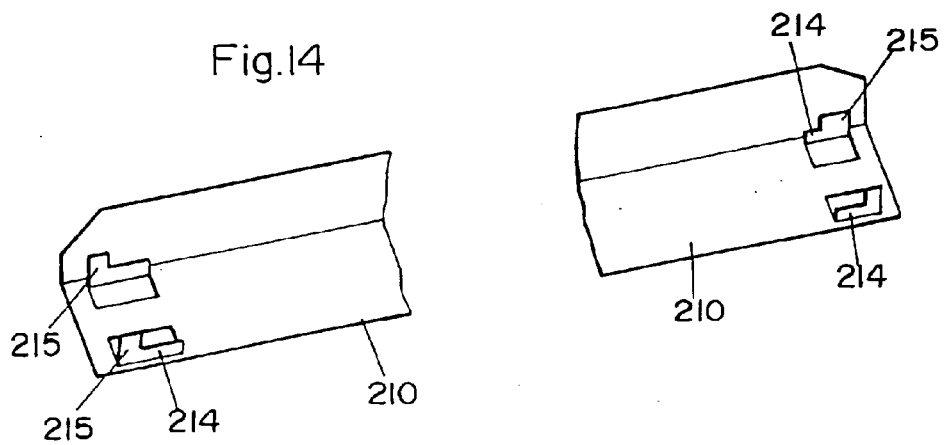
FIG. 14 is a perspective view illustrating end portions of a lower casing.
Figure 15:
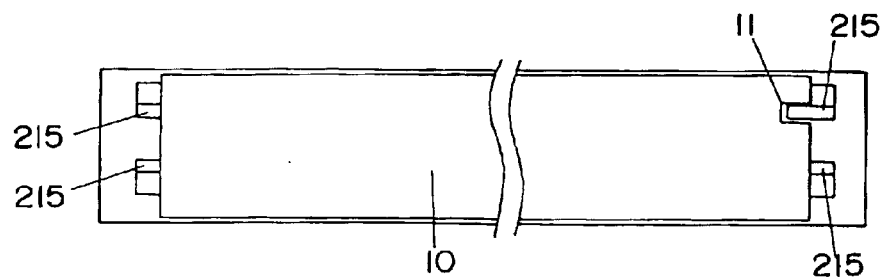
Figure 16:
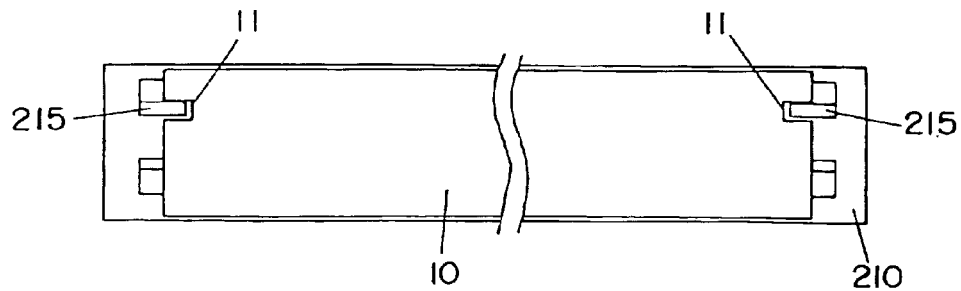
FIG. 16 is a schematic top view illustrating the circuit board supported in position to the lower casing.

As shown in FIG. 1, the circuit board 10 is held on a plurality of stands 214 which are formed at four corners of the bottom 211 of the lower case 210 as being upturned therefrom. One of the stands 214 has an upright fin 215 which fits into a single slit 11 formed at one longitudinal and width end of the circuit board 10. As best shown in FIG. 14, the upright fin 215 of the one stand 214 is made longer than those of the other three stands 214 such that the circuit board 10 can be correctly positioned on the bottom of the lower case 210, while the upright fins of the other three stands abut against the longitudinal ends of the circuit board, as shown in FIG. 15. Thus, the stand 214 with the long fin 215 is cooperative with the slit 11 to define a positioning means for correct assembly of the circuit board in the casing. Alternately, as shown in FIG. 16, the slits 11 may be formed respectively at the longitudinal ends of the circuit board 10 but offset towards one width end thereof so as to receive the correspondingly long upright fins 215 at the longitudinal end of the lower case 210. Further, as shown in FIGS. 17 and 18, one of the stands 214 may be formed with a separate pin 216 for insertion into a corresponding hole 12 of the circuit board 10 for correct positioning of the circuit board.

As shown in FIGS. 19 and 20, a plurality of the circuit boards 10 are prepared in the form of an array in which the boards 10 are arranged side-by-side with a separation line or V-shaped cut S formed between the adjacent ones of the boards. Further, each board 10 is formed to have reduced-in-width section 13 along its length to thereby leave corresponding slits 14 between the adjacent two boards 10. With the provision of the slits 14, the reduced-in-width sections can be less susceptible to a stress which develops when separating the board 10 from the array by bending it along the separation line S. It is this reduced-in-width section 12 that is reserved for mounting the chip components M which is delicate or fragile so as to protect the chip components from the stress applied at the time of separating the board. The chip components typically include chip-type ceramic capacitors.

Turning back to FIG. 1, the upper case 220 has a pair of upper side walls 222 depending from the lateral ends the top 221 to overlap the lower side wall 212 of the lower case 210. The upper side walls 222 are provided respectively with inward projections 223 which engage into corresponding openings 217 in the lower side walls 212 of the lower case 210 to secure the upper case to the lower case. Depending respectively at the longitudinal ends of the upper case 220 are partitions 224 and 225 which are positioned behind the input and output terminal sockets 20 and 30 to conceal the other parts of the ballast in the tubular casing.

What is claimed is:

1. An electronic ballast for a discharge lamp comprising:

an AC-DC converter adapted to be connected to receive a source AC voltage and convert the source AC voltage into a DC voltage;

an inverter providing a high frequency output voltage from said DC voltage for operating the discharge lamp, said inverter comprising at least one switching element, a control circuit for said switching element, and an output transformer adapted to be connected to said discharge lamp, said control circuit activating said switching element to repetitively interrupt said DC voltage to provide the high frequency output voltage to said discharge lamp through said output transformer;

a single circuit board mounting thereon electric parts which constitute said converter and said inverter;

a tubular casing accommodating therein said circuit board; and a dielectric sheet interposed between said circuit board and said casing for insulation of said circuit board and said electric parts from said casing, wherein said ballast includes a plurality of chip components forming a detection circuit for detection of a condition of said discharge lamp, said circuit board mounts said output transformer on its top surface and mounting said chip components on its bottom surface at a location immediately opposite of said output transformer, and said detection circuit is provided to detect an operating condition of said discharge lamp and includes a resistor network composed of chip resistors for dividing the output voltage of said inverter into a detection voltage which is fed to said control circuit for control of said inverter.

2. The ballast as set forth in claim 1, wherein said detection circuit further includes a chip capacitor which is surface-mounted on the bottom surface of said circuit board together with said chip resistors.

3. An electronic ballast for a discharge lamp comprising:

an AC-DC converter adapted to be connected to receive a source AC voltage and convert the source AC voltage into a DC voltage;

an inverter providing a high frequency output voltage from said DC voltage for operating the discharge lamp, said inverter comprising at least one switching element, a control circuit for said switching element, and an output transformer adapted to be connected to said discharge lamp, said control circuit activating said switching element to repetitively interrupt said DC voltage to provide the high frequency output voltage to said discharge lamp through said output transformer;

a single circuit board mounting thereon electric parts which constitute said converter and said inverter;

a tubular casing accommodating therein said circuit board; and a dielectric sheet interposed between said circuit board and said casing for insulation of said circuit board and said electric parts from said casing, wherein said ballast includes a plurality of chip components forming a detection circuit for detection of a condition of said discharge lamp, said circuit board mounts said output transformer on its top surface and mounting said chip components on its bottom surface at a location immediately opposite of said output transformer, and said detection circuit is provided for detection of whether said discharge lamp is connected to said inverter, said detection circuit being in the form of a resistor network which is composed of chip resistors, and said chip resistors being surface-mounted on the bottom of said circuit board immediately opposite of said output transformer.

4. An electronic ballast for a discharge lamp comprising:

an AC-DC converter adapted to be connected to receive a source AC voltage and convert the source AC voltage into a DC voltage;

an inverter providing a high frequency output voltage from said DC voltage for operating the discharge lamp, said inverter comprising at least one switching element, a control circuit for said switching element, and an output transformer adapted to be connected to said discharge lamp, said control circuit activating said switching element to repetitively interrupt said DC voltage to provide the high frequency output voltage to said discharge lamp through said output transformer;

a single circuit board mounting thereon electric parts which constitute said converter and said inverter;

a tubular casing accommodating therein said circuit board; and a dielectric sheet interposed between said circuit board and said casing for insulation of said circuit board and said electric parts from said casing, wherein said ballast includes a plurality of chip components forming a detection circuit for detection of a condition of said discharge lamp, said circuit board mounts said output transformer on its top surface and mounting said chip components on its bottom surface at a location immediately opposite of said output transformer, and said output transformer is of a flat configuration, said dielectric sheet having an extension which covers the entire top face of said output transformer for insulation thereof from said casing.

5. An electronic ballast for a discharge lamp comprising:

an AC-DC converter adapted to be connected to receive a source AC voltage and convert the source AC voltage into a DC voltage;

an inverter providing a high frequency output voltage from said DC voltage for operating the discharge lamp, said inverter comprising at least one switching element, a control circuit for said switching element, and an output transformer adapted to be connected to said discharge lamp, said control circuit activating said switching element to repetitively interrupt said DC voltage to provide the high frequency output voltage to said discharge lamp through said output transformer;

a single circuit board mounting thereon electric parts which constitute said converter and said inverter;

a tubular casing accommodating therein said circuit board; and a dielectric sheet interposed between said circuit board and said casing for insulation of said circuit board and said electric parts from said casing, wherein said ballast includes a plurality of chip components forming a detection circuit for detection of a condition of said discharge lamp, said circuit board mounts said output transformer on its top surface and mounting said chip components on its bottom surface at a location immediately opposite of said output transformer, and said inverter includes a smoothing capacitor which accumulates therein said DC voltage from said converter, and further includes a set of capacitors which generate a relatively large amount of heat, said circuit board being of an elongated configuration and mounting said output transformer and a set of said capacitors on its top surface at its opposite longitudinal ends thereof, respectively, said smoothing capacitor being mounted on the top surface of said circuit board intermediate between the longitudinal ends thereof.

6. The ballast as set forth in claim 5, wherein said casing is of an elongated configuration and is composed of a lower case having a base and a pair of lower side walls upstanding from the opposite lateral sides of the base, and an upper case having a top and a pair of upper side walls depending from the opposite lateral sides of the top to overlap the lower side walls, respectively, said switching element being molded into a flat resin package and being mounted on said circuit board intermediate the opposite longitudinal ends and at one lateral side of said circuit board to project on the top surface of said circuit board, said resin package having a major surface being held in intimate contact with one of said lower side walls for escaping heat generated at the switching element to the lower case.

7. The ballast as set forth in claim 6, wherein the one of said lower side walls is formed with a recess of which bottom projects inwardly of said lower case, said recess being located intermediate the longitudinal ends of the lower case, said package being secured to the bottom of said recess by means of a spring clip for making said major surface of said package intimate contact with the bottom of said recess, said spring clip being shaped into a U-shaped configuration having a pair of resilient legs connected by a thin flat member for pinching an upper portion of the package and the bottom of said recess between said legs, said thin flat member being held in intimated contact with a top of said package as well as with said top of said upper case for escaping the heat generated at the package also to said upper case through said member, said resilient leg having a thickness which is smaller than a depth of said recess.

8. An electronic ballast for a discharge lamp comprising:

an AC-DC converter adapted to be connected to receive a source AC voltage and convert the source AC voltage into a DC voltage;

an inverter providing a high frequency output voltage from said DC voltage for operating the discharge lamp, said inverter comprising at least one switching element, a control circuit for said switching element, and an output transformer adapted to be connected to said discharge lamp, said control circuit activating said switching element to repetitively interrupt said DC voltage to provide the high frequency output voltage to said discharge lamp through said output transformer;

a single circuit board mounting thereon electric parts which constitute said converter and said inverter;

a tubular casing accommodating therein said circuit board; and a dielectric sheet interposed between said circuit board and said casing for insulation of said circuit board and said electric parts from said casing, wherein said ballast includes a plurality of chip components forming a detection circuit for detection of a condition of said discharge lamp, said circuit board mounts said output transformer on its top surface and mounting said chip components on its bottom surface at a location immediately opposite of said output transformer, and said inverter includes a pair of switching elements connected in series across an output of said AC-DC converter, said control circuit including a driver having a level-shift circuit for providing a high driving voltage to turn on a high side one of said switching elements, said control circuit being integrated together with said driver into a single chip, said chip being mounted on the bottom surface of said circuit board at a location intermediate between the longitudinal ends of said circuit board.

9. The ballast as set forth in claim 5, wherein said inverter includes a plurality of capacitors each in the form of a film capacitor, said circuit board being provided on its top surface at the longitudinal ends respectively with an input terminal socket for connection of said converter to said source AC voltage and an output terminal socket for connection of the output transformer to said discharge lamp, said output transformer being disposed adjacent to said output terminal, said film capacitors being mounted collectively on said circuit board between said output transformer and said output terminal socket.

10. The ballast as set forth in claim 4, wherein said circuit board is of an elongated configuration having an approximately uniform width which is nearly equal to a width of said output transformer, the width of said transformer being largest among all of said electric parts.

11. The ballast as set forth in claim 8, wherein
said circuit board is formed on its bottom surface with a ground line for said inverter, and with a main current path carrying a high frequency current to said output transformer, said chip of said control circuit being isolated from said main current path by said ground line, and said main current path including a pair of main current lines major portions of which run in close parallel relation to each other.

12. An electronic ballast for a discharge lamp comprising:
an AC-DC converter adapted to be connected to receive a source AC voltage and convert the source AC voltage into a DC voltage;
an inverter providing a high frequency output voltage from said DC voltage for operating the discharge lamp, said inverter comprising at least one switching element, a control circuit for said switching element, and an output transformer adapted to be connected to said discharge lamp, said control circuit activating said switching element to repetitively interrupt said DC voltage to provide the high frequency output voltage to said discharge lamp through said output transformer;
a single circuit board mounting thereon electric parts which constitute said converter and said inverter;
a tubular casing accommodating therein said circuit board; and
a dielectric sheet interposed between said circuit board and said casing for insulation of said circuit board and said electric parts from said casing, wherein
said ballast includes a plurality of chip components forming a detection circuit for detection of a condition of said discharge lamp,
said circuit board mounts said output transformer on its top surface and mounting said chip components on its bottom surface at a location immediately opposite of said output transformer, and
said circuit board is of an elongated configuration and is separated from an array in which a plurality of said circuit boards are arranged side-by-side with a separation line between the adjacent ones of said circuit boards,
each of said circuit boards having a reduced-in-width section within the length thereof to define a slit along said separation line between the adjacent circuit boards,
said inverter including at least one capacitor in the form of a chip-type ceramic capacitor, said chip-type ceramic capacitor being mounted on said reduced-in-width section.

13. An electronic ballast for a discharge lamp comprising:
an AC-DC converter adapted to be connected to receive a source AC voltage and convert the source AC voltage into a DC voltage;
an inverter providing a high frequency output voltage from said DC voltage for operating the discharge lamp, said inverter comprising at least one switching element, a control circuit for said switching element, and an output transformer adapted to be connected to said discharge lamp, said control circuit activating said switching element to repetitively interrupt said DC voltage to provide the high frequency output voltage to said discharge lamp through said output transformer;
a single circuit board mounting thereon electric parts which constitute said converter and said inverter;
a tubular casing accommodating therein said circuit board; and
a dielectric sheet interposed between said circuit board and said casing for insulation of said circuit board and said electric parts from said casing, wherein
said ballast includes a plurality of chip components forming a detection circuit for detection of a condition of said discharge lamp,
said circuit board mounts said output transformer on its top surface and mounting said chip components on its bottom surface at a location immediately opposite of said output transformer, and
said circuit board is of an elongated configuration,
said electric parts including a plurality of chips each having terminals on opposite ends thereof, respectively,
said chips being mounted on the bottom surface of said circuit board with said terminals oriented in a width direction of said circuit board.

14. An electronic ballast for a discharge lamp comprising:
an AC-DC converter adapted to be connected to receive a source AC voltage and convert the source AC voltage into a DC voltage;
an inverter providing a high frequency output voltage from said DC voltage for operating the discharge lamp, said inverter comprising at least one switching element, a control circuit for said switching element, and an output transformer adapted to be connected to said discharge lamp, said control circuit activating said switching element to repetitively interrupt said DC voltage to provide the high frequency output voltage to said discharge lamp through said output transformer;
a single circuit board mounting thereon electric parts which constitute said converter and said inverter;
a tubular casing accommodating therein said circuit board; and
a dielectric sheet interposed between said circuit board and said casing for insulation of said circuit board and said electric parts from said casing, wherein
said ballast includes a plurality of chip components forming a detection circuit for detection of a condition of said discharge lamp,
said circuit board mounts said output transformer on its top surface and mounting said chip components on its bottom surface at a location immediately opposite of said output transformer, and
said dielectric sheet is provided with a plurality of studs for supporting said circuit board.

15. An electronic ballast for a discharge lamp comprising:
an AC-DC converter adapted to be connected to receive a source AC voltage and convert the source AC voltage into a DC voltage;
an inverter providing a high frequency output voltage from said DC voltage for operating the discharge lamp, said inverter comprising at least one switching element, a control circuit for said switching element, and an output transformer adapted to be connected to said discharge lamp, said control circuit activating said switching element to repetitively interrupt said DC voltage to provide the high frequency output voltage to said discharge lamp through said output transformer;
a single circuit board mounting thereon electric parts which constitute said converter and said inverter;
a tubular casing accommodating therein said circuit board; and
a dielectric sheet interposed between said circuit board and said casing for insulation of said circuit board and said electric parts from said casing, wherein said ballast includes a plurality of chip components forming a detection circuit for detection of a condition of said discharge lamp, said circuit board mounts said output transformer on its top surface and mounting said chip components on its bottom surface at a location immediately opposite of said output transformer, and said case is provided with positioning means for holding said circuit board in a correct position.

16. An electronic ballast for a discharge lamp comprising:

an AC-DC converter adapted to be connected to receive a source AC voltage and convert the source AC voltage into a DC voltage;

an inverter providing a high frequency output voltage from said DC voltage for operating the discharge lamp, said inverter comprising at least one switching element, a control circuit for said switching element, and an output transformer adapted to be connected to said discharge lamp, said control circuit activating said switching element to repetitively interrupt said DC voltage to provide the high frequency output voltage to said discharge lamp through said output transformer;

a single circuit board mounting thereon electric parts which constitute said converter and said inverter;

a tubular casing accommodating therein said circuit board; and a dielectric sheet interposed between said circuit board and said casing for insulation of said circuit board and said electric parts from said casing, wherein said ballast includes a plurality of chip components forming a detection circuit for detection of a condition of said discharge lamp, said circuit board mounts said output transformer on its top surface and mounting said chip components on its bottom surface at a location immediately opposite of said output transformer, and said output transformer includes a first auxiliary winding which provides a driving voltage for energizing said control circuit, a second auxiliary winding which provides a detection output indicative of the high frequency output voltage for monitoring the operation of said inverter, and a third auxiliary winding which provides a preheat current to filaments of said discharge lamp.

17. The ballast as set forth in claim 16, wherein said output transformer is a leakage transformer having a primary winding connected in circuit to flow a high frequency current, and a secondary winding magnetically coupled to said primary winding to induce a resulting high frequency voltage which is applied to said discharge lamp, said first auxiliary winding being coupled to said primary winding, said second and third auxiliary windings being coupled to said secondary winding.

18. An electronic ballast for a discharge lamp comprising:

an AC-DC converter adapted to be connected to receive a source AC voltage and convert the source AC voltage into a DC voltage;

an inverter providing a high frequency output voltage from said DC voltage for operating the discharge lamp, said inverter comprising at least one switching element, a control circuit for said switching element, and an output transformer adapted to be connected to said discharge lamp, said control circuit activating said switching element to repetitively interrupt said DC voltage to provide the high frequency output voltage to said discharge lamp through said output transformer;

a single circuit board mounting thereon electric parts which constitute said converter and said inverter;

a tubular casing accommodating therein said circuit board; and a dielectric sheet interposed between said circuit board and said casing for insulation of said circuit board and said electric parts from said casing, wherein said ballast includes a plurality of chip components forming a detection circuit for detection of a condition of said discharge lamp, said circuit board mounts said output transformer on its top surface and mounting said chip components on its bottom surface at a location immediately opposite of said output transformer, and said AC-DC converter includes a rectifier providing the rectified DC voltage, said control circuit including a dropping resistor which is connected to said rectifier for deriving a DC voltage for energizing said control circuit at the time of starting the inverter.

19. An electronic ballast for a discharge lamp comprising:

an AC-DC converter adapted to be connected to receive a source AC voltage and convert the source AC voltage into a DC voltage;

an inverter providing a high frequency output voltage from said DC voltage for operating the discharge lamp, said inverter comprising at least one switching element, a control circuit for said switching element, and an output transformer adapted to be connected to said discharge lamp, said control circuit activating said switching element to repetitively interrupt said DC voltage to provide the high frequency output voltage to said discharge lamp through said output transformer;

a single circuit board mounting thereon electric parts which constitute said converter and said inverter;

a tubular casing accommodating therein said circuit board; and a dielectric sheet interposed between said circuit board and said casing for insulation of said circuit board and said electric parts from said casing, wherein said ballast includes a plurality of chip components forming a detection circuit for detection of a condition of said discharge lamp, said circuit board mounts said output transformer on its top surface and mounting said chip components on its bottom surface at a location immediately opposite of said output transformer, and said inverter is of a charge-pump type having a capacitor which is connected in a path of receiving an input current from said AC-DC converter and flowing the input current through an oscillating element of the inverter and through the switching element for suppressing harmonics in the input current from said source AC voltage.

20. The ballast as set forth in claim 19, wherein said ballast includes an adjusting means mounted on said circuit board to adjust output characteristics of said discharge lamp.

21. The ballast as set forth in claim 20, wherein said adjustor means operates to adjust a lamp start output power and a lamp operating output power fed to said discharge lamp respectively at the time of starting the lamp and during the steady-state operation of the lamp.

22. An electronic ballast for a discharge lamp comprising:

an AC-DC converter adapted to be connected to receive a source AC voltage and convert the source AC voltage into a DC voltage;

an inverter providing a high frequency output voltage from said DC voltage for operating the discharge lamp, said inverter comprising at least one switching element, a control circuit for said switching element, and an output transformer adapted to be connected to said discharge lamp, said control circuit activating said switching element to repetitively interrupt said DC voltage to provide the high frequency output voltage to said discharge lamp through said output transformer;

a single circuit board mounting thereon electric parts which constitute said converter and said inverter;

a tubular casing accommodating therein said circuit board; and a dielectric sheet interposed between said circuit board and said casing for insulation of said circuit board and said electric parts from said casing, wherein said ballast includes a plurality of chip components forming a detection circuit for detection of a condition of said discharge lamp, said circuit board mounts said output transformer on its top surface and mounting said chip components on its bottom surface at a location immediately opposite of said output transformer, and said detection circuit includes a resistor network composed of chip resistors for dividing the output voltage of said inverter into a detection voltage which is fed to said control circuit for control of said inverter, said detection circuit also including a chip capacitor which is surface-mounted on the bottom surface of said circuit board together with said chip resistors, said ballast further including another detection circuit in the form of a resistor network which is composed of chip resistors for detection of whether said discharge lamp is connected to said inverter, said chip resistors being surface-mounted on the bottom of said circuit board immediately opposite of said output transformer, said inverter including a pair of switching elements connected in series across an output of said AC-DC converter, said control circuit including a driver having a level-shift circuit for providing a high driving voltage to turn on a high side one of said switching elements, said control circuit being integrated together with said driver into a single chip, said chip being mounted on the bottom surface of said circuit board at a location intermediate the longitudinal ends of said circuit board, and said inverter being of a charge-pump type having a capacitor which is connected in a path of receiving an input current from said AC-DC converter and flowing the input current through an oscillating element of the inverter and through the switching element for suppressing harmonics in the input current from said source AC voltage.

* * * * *

UNITED STATES PATENT AND TRADEMARK OFFICE
CERTIFICATE OF CORRECTION

PATENT NO. : 6,943,502 B2
DATED : September 13, 2005
INVENTOR(S) : Yukio Yamanaka et al.

It is certified that error appears in the above-identified patent and that said Letters Patent is hereby corrected as shown below:

Column 6,
Line 27, change "16" to -- 15 --.

Column 11,
Line 15, change "10A" to -- 100A --.

Signed and Sealed this

Fourteenth Day of February, 2006

JON W. DUDAS
*Director of the United States Patent and Trademark Office*